Feb. 28, 1939. G. L. BEERS Re. 21,014

ELECTRIC AMPLIFIER

Original Filed Aug. 13, 1927 3 Sheets-Sheet 1

INVENTOR
George L. Beers.
BY
Wesley G. Carr
ATTORNEY

Feb. 28, 1939. G. L. BEERS Re. 21,014

ELECTRIC AMPLIFIER

Original Filed Aug. 13, 1927 3 Sheets-Sheet 2

INVENTOR
George L. Beers.

BY
Wesley G. Carr
ATTORNEY

Feb. 28, 1939. G. L. BEERS Re. 21,014

ELECTRIC AMPLIFIER

Original Filed Aug. 13, 1927 3 Sheets-Sheet 3

WITNESSES:
C. J. Weller.
E. Broeler

INVENTOR
George L. Beers.
BY F. W. Lyle.
ATTORNEY

Reissued Feb. 28, 1939 Re. 21,014

UNITED STATES PATENT OFFICE 21,014

ELECTRIC AMPLIFIER

George L. Beers, Collingswood, N. J., assignor to Westinghouse Electric & Manufacturing Company, a corporation of Pennsylvania Original No. 1,960,723, dated May 29, 1934, Serial No. 212,791, August 13, 1927. Application for reissue May 28, 1936, Serial No. 82,383

23 Claims. (Cl. 250—20)

My invention relates to electric amplifiers, and it has particular relation to such amplifiers utilized in connection with the reception of radio signals and signals transmitted over wire lines by means of carrier currents.

The reception of radio signals, and of signals transmitted by carrier currents over line wires, popularly known as "wired-wireless", is often affected by the phenomenon known as "fading." The fading may be caused by fluctuations in the attenuation of the signal in the transmitting medium, or, as it is sometimes stated, it may be caused by variations in the height of the so-called Heaviside layer. Irrespective of the actual cause of fading, however, it results in a very annoying variation in the amplitude of the ultimate sound output of a receiving set, at times causing the signal to decrease almost below audition, and at other times causing the loud speaker to be overloaded.

It is accordingly one object of my invention to provide, in an amplifying system, instrumentalities and circuit connections therefor, whereby fluctuations in the amplitude of an incoming signal shall be compensated.

Another object of my invention is to provide an automatic volume control for an amplifier that shall compensate variations in the input voltage to any stage thereof.

Another object of my invention is to provide, in radio receiving apparatus, automatic means for limiting the effect of a powerful local station on the loud speaker, or other sound-producing instrumentality, if the apparatus is inadvertently tuned to the carrier frequency of said local station during the operation of tuning to receive distant stations.

Another, and more specific, object of my invention is to provide, in an amplifier system, means for changing the volume control thereof from automatic actuation to manual actuation.

To attain the aforementioned objects, I provide in one embodiment of my invention, an amplifier with an auxiliary volume-control device in the nature of a thermionic tube having its grid so negatively biased that it functions as a detector. The plate, or output, circuit of the control device comprises a resistor having a value in the neighborhood of .5 megohm shunted by a condenser of about 4 microfarads capacity, and the said resistor is included in the input, or grid circuit of the tubes that are to be controlled.

The resistor and the condenser form a network having such a time constant that the audio-frequency component of the detector tube ouput develops no voltage across it, such voltage being developed only by components below audibility, or, in other words, components corresponding to the usual rate of fading. The fading rate, in general, varies from one cycle in five minutes to approximately five cycles per minute. A connection is provided between an appropriate point in the amplifier circuits and the grid of the control tube, whereby a portion of the potential of an incoming signal may be impressed thereon. The changes in the resistance, or IR drop in the output resistor, caused by changes in the average amplitude of the signal, are, by suitable connections, applied to the grid of the amplifier tube controlled thereby, or to the grids of a plurality of amplifier tubes, in order that a signal which is increasing in strength will meet an amplifier having less effective amplification than normal, and a signal which is decreasing in strength will meet an amplifier having more effective amplification than normal.

In order that the output of the amplifier may be adjusted to a predetermined level, and may be maintained fixed at such level, the grid of the control-device may be provided with appropriate biasing means to fix its normal potential with reference to the potential applied thereto from an incoming signal. If, for example, the voltage for the actuation of the control-device, is derived from the input circuit of a power-tube used as a second detector, in which the voltage for a desired output level should not be greater than approximately thirty volts, I have found that good results are obtained by biasing the control-device grid to a potential of approximately thirty volts. Specifically, in the case just referred to, the bias applied to the control-device grid would be thirty volts more negative than the cutoff potential, thus preventing the said control-device from functioning until the voltage on the second detector exceeds thirty volts, and preventing it from drawing grid current until the said voltage exceeds thirty by an amount substantially equal to the cutoff potential.

For higher output levels the voltage on the control device grid is made more negative than in the example just given, and for lower output levels it is made less negative. In any event, the grid is given a potential that is more negative than the cutoff potential, the increase in the negative direction being approximately equal to the voltage on the second detector grid which gives rise to the output level desired.

Such an arrangement permits the use of a relatively low potential of approximately ninety volts on the plate of the control-device, and a tube analogous to the well known Radiotron 201-A may accordingly be utilized therefor.

Among the features that I consider characteristic of my invention are those set forth with particularity in the appended claims. The invention itself, however, both as to its organization and its method of operation, together with further objects and advantages thereof, will best be understood by reference to the following description, taken in connection with the accompanying drawings, in which Figure 1 is a diagrammatic view of a preferred embodiment of my invention, illustrating a number of ways in which it may be applied to any desired stage of an amplifier.

My invention is applicable to substantially any stage of a radio frequency amplifier, or substantially any stage of an intermediate frequency amplifier, such as is found in receiving sets of the superheterodyne type. It is also feasible to derive the control potentials for my device from any one of the above-referred to stages. For this reason, in order to simplify the explanation of my invention, I have shown my invention in Fig. 1 associated with appropriate circuit connections for applying it to any desired amplifier stage. In the actual practice of my invention, the majority of the connections shown in Fig. 1 are eliminated, only those being retained which serve to control the appropriate stage, or stages.

Figure 1:
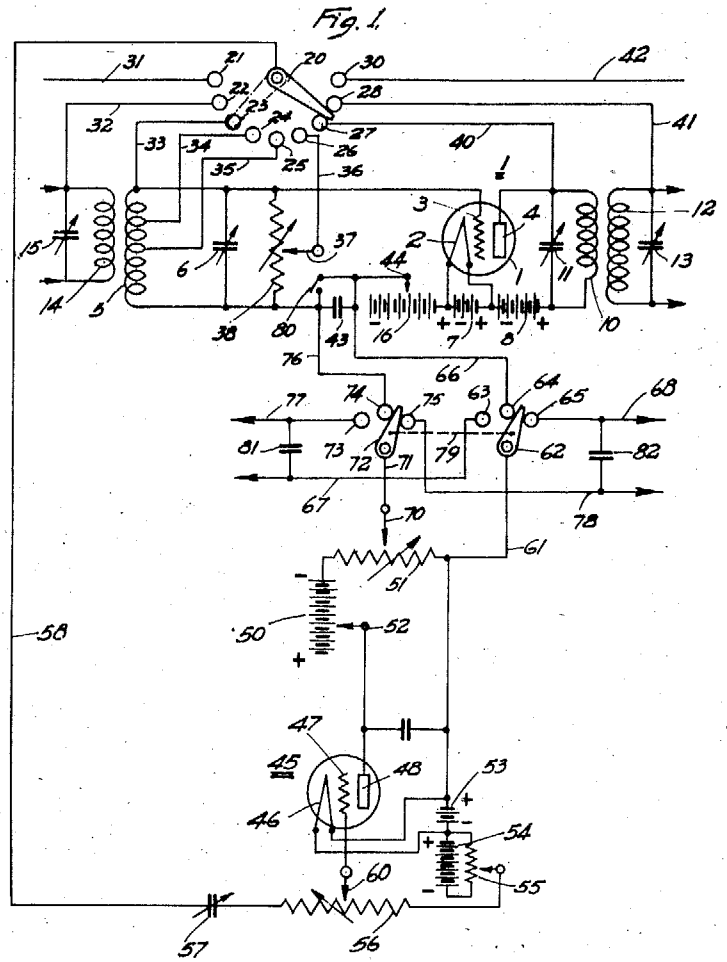

Referring specifically to Fig. 1, a thermionic device 1 having a filament 2, a grid 3 and a plate 4 is comprised in an amplifying stage. The input circuit for the thermionic device comprises an inductor 5, shunted by a tuning condenser 6. The filament 2 is energized from a battery 7 and plate potential is supplied from battery 8, connected in series with an inductor 10 shunted by a tuning condenser 11, a common connection of the inductor and condenser being connected to the plate 4 of the thermionic device.

An inductor 12 having a condenser 13 connected in shunt thereto is coupled to the output inductor 10 and is comprised in the input circuit of a succeeding amplifier stage.

An inductor 14 having a tuning condenser 15 connected in shunt thereto is coupled to the input inductor 5, the inductor 14 being comprised in the output circuit of an antenna or a preceding amplifier stage. A C-battery 16 for appropriately biasing the grid has its positive pole connected to the filament 2 and functions in a manner which will later be described in detail.

A switch arm 20 cooperating with a plurality of fixed contacts 21, 22, 23, 24, 25, 26, 27, 28, and 30 is provided. The contact 21 may be connected to any appropriate point in the stages of the amplifier preceding the thermionic device 1 by means of a conductor 31. The fixed contact 22 is connected by a conductor 32 to the output circuit which comprises the inductor 14 and the tuning condenser 15. The fixed contacts 23, 24 and 25 are connected to separated points on the input inductor 5 by means of conductors 33, 34 and 35 respectively. The fixed contact 26 is connected by means of a conductor 36 to a movable arm 37, which makes contact with a resistor 38 connected in shunt to the input inductor 5. The fixed contact 27 is connected to the plate of the thermionic tube 1 by means of a conductor 40 or may be connected to an intermediate point on the inductor 10. The fixed contact 28 is connected in a similar manner to the input inductor 12 by a conductor 41, or it may be connected to an intermediate point thereon. A conductor 42 is connected to the fixed contact 30 and extends to an appropriate point in a stage of the amplifier succeeding the thermionic device 1.

One end of the input inductor 5 is connected through a bypass condenser 43 and a movable contact 44 to any desired point on the C-battery 16, whereby the initial sensitivity of the receiver may be controlled.

A control device 45, preferably a thermionic tube having a filament 46, a grid 47, and a plate 48, is provided with an output circuit comprising a B-battery 50, and a resistor 51, the B-battery being adjustably connected to the plate by means of a movable contact device 52. The filament is energized from a separate potential source 53. The positive pole of a C-battery 54, is connected to the filament and is adjustably connected to the switch arm 20, through a movable contact device 55, a variable resistor 56, a condenser 57 and a conductor 58.

The grid 47 is adjustably connected to the resistor 56 by means of a contact device 60.

The end of the resistor 51 which is connected to the filament 46 of the control tube, is also connected by means of a conductor 61 to a switch arm 62 with which are associated a plurality of fixed contacts 63, 64 and 65. The fixed contact 64 is connected by means of a conductor 66 to the contact device 44 associated with the C-battery 16. The fixed contact 63 is connected by a conductor 67 to an appropriate point in the grid or input circuit of a preceding amplifying stage. The fixed contact 65 is connected by a conductor 68 to an appropriate point in the input or grid circuit of a succeeding amplifier stage.

A movable device 70 is associated with the resistor 51 and is connected by means of a conductor 71 to a movable switch arm 72 with which is associated a plurality of fixed contacts 73, 74 and 75. The fixed contact 74 is connected by a conductor 76 to the lower end of the input inductor 5. The fixed contact 73 is connected by a conductor 77 to an appropriate point in the input circuit to a preceding amplifier stage, while the fixed contact 75 is connected by a conductor 78 to an appropriate point in a succeeding amplifier stage. The switch arms 62 and 72 may be linked together for simultaneous actuation as shown by a dotted line 79 and a switch 80 may be provided to short-circuit the condenser 43, when the control is applied to different amplifier stage.

In order that the operation of the sample form of my invention illustrated in Fig. 1 may be made clear, it is assumed that the switch arm 62 is associated with the fixed contact 64 and that the switch arm 72 is associated with the fixed contact 74. When in this position, a variable portion of the resistor 51 is connected in shunt to the bypass condenser 43 and is, accordingly, included in the input circuit of the thermionic device 1. It is, of course, obvious that by proper manipulation of the linked switch arms, the said resistor may be associated with the input circuit of either a preceding or a succeeding amplifier stage, or by a slight modification with both preceding and succeeding stages in which event the condensers 81 and 82 are analogous to the bypass condenser 43, which may be short-circuited as described previously.

Figure 5:
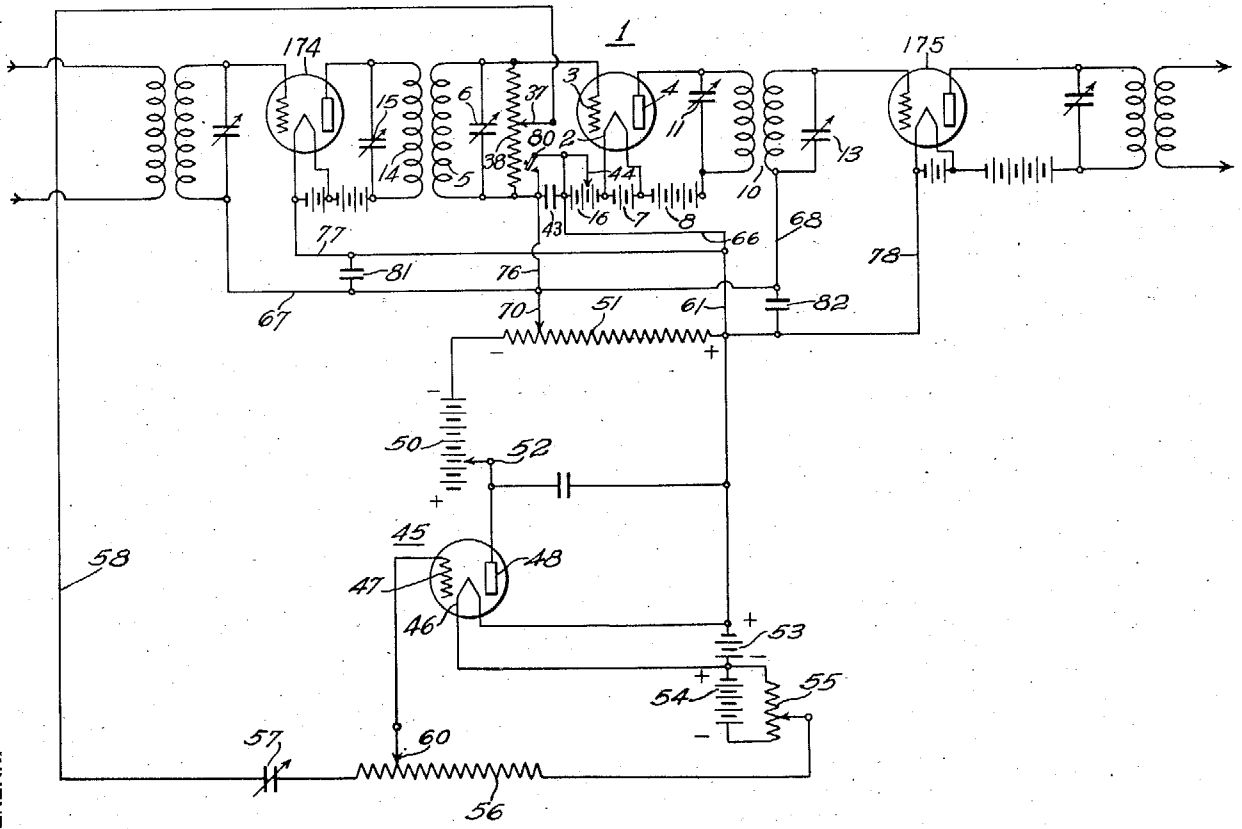
Figure 5 is a diagrammatic view of my invention showing the automatic volume control as applied to amplifiers preceding and following the tube from which the controlling potentials are derived.

Figure 5 illustrates the modification discussed in the preceding paragraph wherein the volume control effect is applied to preceding and succeeding stages with respect to the tube from which the control potentials are obtained. The circuit illustrated has been based on the circuit of Fig. 1, and similar reference numerals apply to corresponding and equivalent elements in both circuits. It is understood, of course, that the same modification may be embodied in any of the other circuits illustrated in the remaining figures of my drawings. It will be apparent from an inspection of the circuit of Fig. 5 that the volume control biasing potential derived from the resistor 51 in the plate circuit of the volume control tube is applied simultaneously to an amplifier 174 preceding the tube from which the control potentials have been derived and to an amplifier 175 following the tube from which the control potentials have been derived.

Although the basic principles underlying the action of the control-tube remain the same irrespective to which portion of the receiving system the control-voltage is applied, it is interesting to note at this point that the results obtained by applying the voltage to a tube ahead of the tube from which the voltage for the control-tube is derived differ from the results obtained when the control is applied to a tube later in the series. In the first case, the ultimate audio-output of the system will not be reduced below a certain predetermined level, no matter how strong the incoming signal may be, while in the second case the various potentials may be so adjusted that a strong signal from a local station will not actuate the loud speaker if the circuits of the system are tuned exactly to the carrier-wave of such station, while weaker signals from distant stations may be received at normal volume.

It is also assumed for purposes of explanation, that the switch arm 20 is resting upon the fixed contact 23 as indicated by the dotted lines. When in this position, the resistor 56 associated with the control tube 45 is connected through the condenser 57 to a point on the amplifier stage including the thermionic device 1 which assumes the highest radio frequency potentials.

The switch arm 20 may obviously be so rotated to associate the resistor 56 with the input circuit of any desired amplifier stage, or with an appropriate point on such circuit, as indicated by the connections to the input inductor and the connection to the potentiometer 38.

When it is desired to receive signals, the filaments of the tubes 1 and 45 are energized and the voltage of the C-battery 16 adjusted in order that the grid 3 of the amplifying tube 1 may be maintained at the best D. C. potential for efficient radio frequency amplification. The bias on the grid of the control tube 45 is adjusted to substantially the cutoff point, i. e., to the potential at which the tube is practically non-conductive. This point is preferably chosen at the lower or negative end of the characteristic curve of the tube. When so biased, the control tube functions as a detector, an incoming signal causing an increased flow of current in the output circuit thereof, which includes the resistor 51.

If desired, the C-battery associated with the amplifier tube may be eliminated, in which case the tube is operated at what is known as zero grid-potential.

By suitably adjusting the normal grid bias on the amplifier tube 1, and by properly varying the amount of the resistor 51 connected in shunt to the condenser 43, the amplifying stage may be placed in condition to efficiently amplify incoming signals of normal average amplitude.

If the average input voltage applied to the amplifier tube tends to increase, because of any variable factor either in the transmitting medium or in the receiving apparatus itself, there is a resulting tendency for the sound reproducer to become overloaded. The same increased voltage applied to the grid of the control tube tends to cause an increase in the average current flowing through the resistor 51. This increase in the average current causes a greater IR, or resistance, drop in the resistor 51 and the point to which the switch arm 72 is connected consequently assumes a more negative potential with respect to the point connected to the switch arm 62 than it had previous to the increase in signal amplitude.

The grid 3 of the amplifier tube 1 being connected to the said point on the resistor is therefore caused to assume a more negative average potential than before and the effective amplification of the tube consequently decreases. It is thus apparent that when an incoming signal tends to overload the amplifier stage such tendency is immediately compensated by the application of a more negative potential to the grid of the thermionic device with reference to the filament thereof.

It has also been found feasible to so arrange the device that a signal of an amplitude which causes the desired sound output from the ultimate stages of the amplifier is just sufficient in amplitude to cause enough drop through the resistor to keep the thermionic amplifier tube biased to an intermediate point on its effective amplification curve. A decrease, therefore, in signal amplitude will result in a more positive bias being applied to the amplifier stage and consequently an increase in the effective amplification thereof, while an increase in the amplitude of an incoming signal will so bias the said stage, as was previously explained, as to decrease its effective amplification.

It is also possible to reverse the connections to the resistor 51 shown in Fig. 1, so arranging the system that an increase in amplitude of the incoming signal causes the grid of the amplifying tube to swing sufficiently positive with respect to the filament thereof to obtain practically the same results as if the grid were caused to swing more negative.

In certain receiving systems, the strength of signal derived from the amplifier is insufficient to properly actuate the control tube. In such case, a high frequency amplifying stage may be interposed between the amplifier proper and the control tube or the system may be arranged in a manner analogous to that illustrated in Fig. 2.

In the latter figure, the control tube with its associated batteries, circuit connections, etc., is shown as being replaced by a detector-amplifier system. The elements of Fig. 2 which are analogous to those of Fig. 1 are similarly numbered.

The output resistance 51 instead of being directly connected to the linked switch arms 62 and 72 is connected between the grid 90 and the filament 91 of a second thermionic device 92, which is supplied with filament power from a separate source 93. The output circuit of the thermionic device 92 comprises a source of potential 94 and a resistor 95 analogous to the resistor 51 shown in Fig. 1. With this resistor are associated the switch arms 62 and 72 together with the cooperating fixed contacts.

Figure 2:
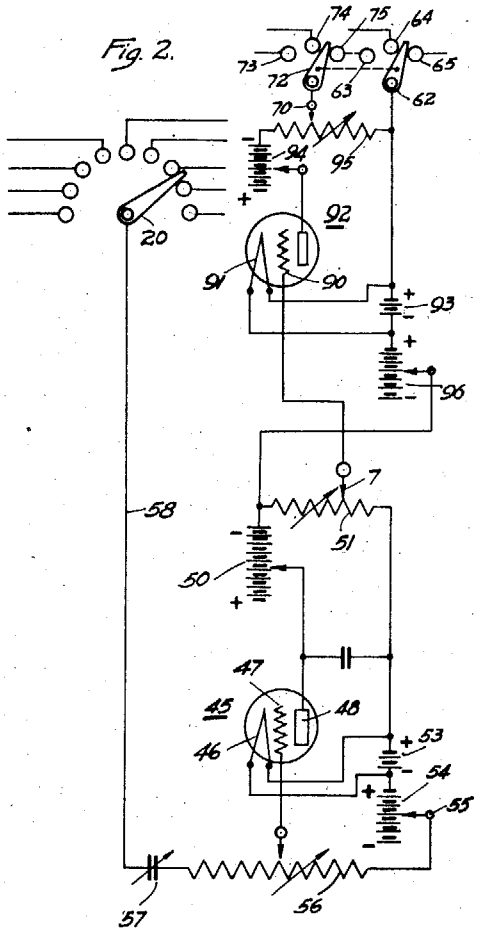
Fig. 2 is a diagrammatic view of a form of my invention that may be utilized under certain conditions, as, for example, when it is desired to control a thermionic tube handling a considerable amount of power, or where the voltage available for control purposes is insufficient.

The operation of the modification shown in Fig. 2 may be explained by assuming that the incoming signal which is tending to increase, or is increasing, in amplitude, is applied to the grid 47 of the control tube through the conductor 58 and the resistor 56. The control tube, being biased to substantially the cut-off point, functions as a detector, in a manner well-known to those skilled in the art. The incoming signal, therefore, causes an increase in the current flowing in the output circuit thereof including the resistor 51, causing the end of the resistor 51 associated with the C-battery 96 to become more negative with respect to the point on the resistor connected to the grid 90 than it was previously to the signal increase. The current in the resistor 95 included in the output circuit of the tube 92, consequently increases, and the switch arm 72, which is connected to the grid of the appropriate amplifier stage, becomes more negative with respect to the switch arm 62, connected to the filament of the same stage, than it was previous to the signal amplitude increase. The tube 92 may be of considerably higher power than the control tube 45, the IR or resistance, drop in the resistor 95 may thus be made considerably greater than the drop in the analogous resistor 51 shown in Fig. 1.

The system illustrated in Fig. 2 has proved to be of considerable advantage in a receiving set of the type in which the high-frequency voltage developed is insufficient to properly actuate the system shown in Fig. 1.

My invention is capable of being applied to substantially any radio-receiving system known to the art at present, including systems in which equi-potential cathode tubes are utilized. To illustrate however, the numerous variations in form which my invention may take when applied to a variety of different radio receiving systems would necessitate a large number of drawings and would require a great deal of repetitious explanation. I have, therefore, chosen for purposes of further description, the application of a preferred form of my invention to a receiving system of the superheterodyne type, in which a common voltage source is utilized to supply plate potential and grid bias to both the amplifier tubes and the control tube.

Figures 3, 4:
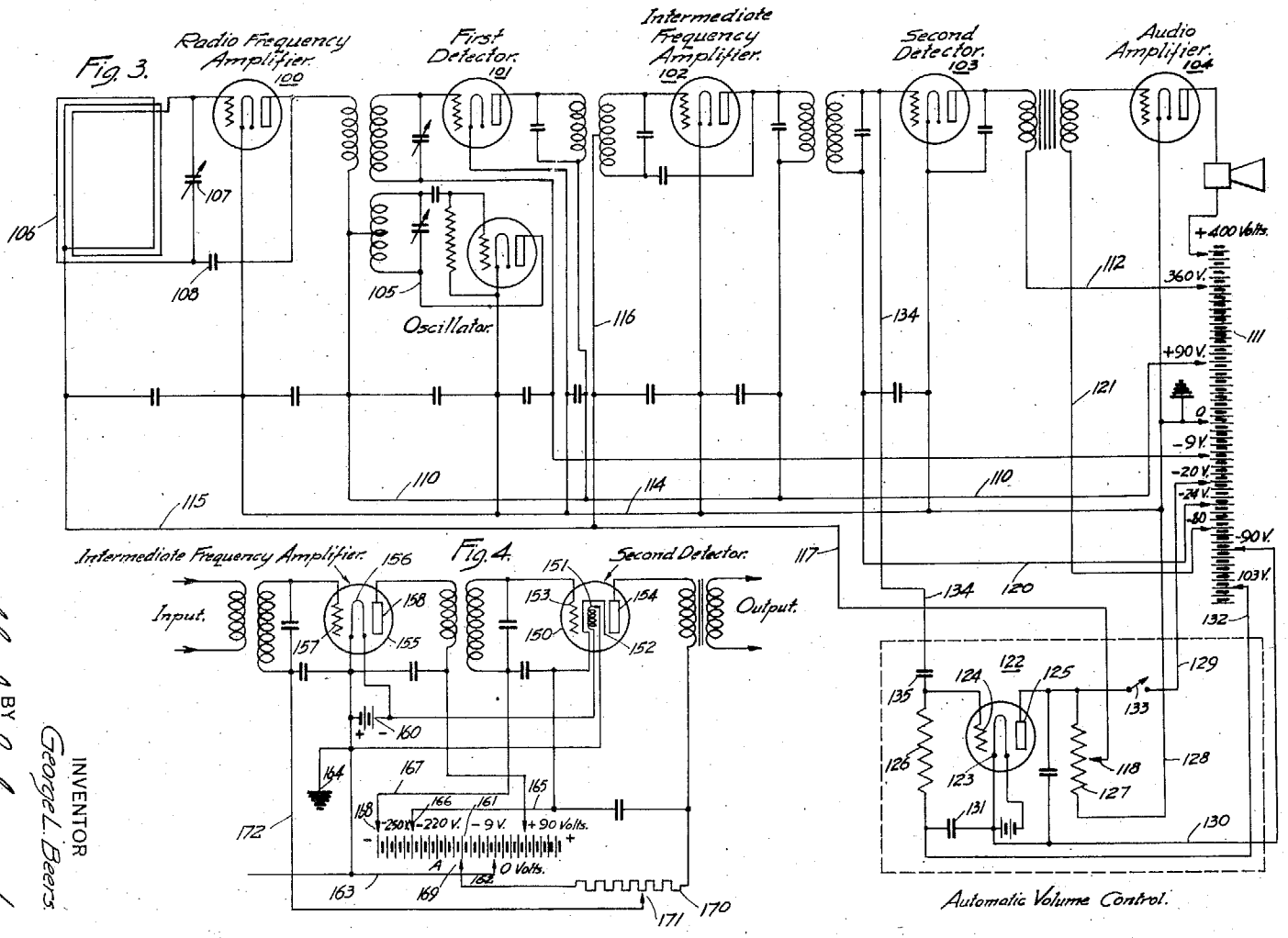
Fig. 3 is a diagrammatic view of a complete receiving system of the superheterodyne type, illustrating the application thereto of a preferred form of my invention.
Fig. 4 is a diagrammatic view of a modified form of my invention, wherein the control-voltage is obtained directly from the plate circuit of the second detector-tube in a superheterodyne receiving system.

Referring specifically to Fig. 3, a radio receiving set of the superheterodyne type comprising a radio-frequency amplifying stage 100, a first detector 101, an intermediate, or beat, frequency amplifying stage 102, a second detector 103, an audio frequency amplifying stage 104 and an oscillation generator 105, is illustrated. Each of the stages shown, with the exception of the first and second detector could, in practice, comprise a plurality of tubes, but in order to simplify the diagram the amplifying stages are illustrated as comprising only a single tube each.

Inasmuch as the operation of the control tube is greatly facilitated by the utilization of relatively high input-voltages, it is desirable to provide a source of such voltages in the receiving system. Perhaps the most convenient method is to employ as a second detector a tube of the power-type, capable of handling an input voltage swing of as much as thirty volts, and delivering sufficient power to enable the discarding of one of the two audio-frequency amplification stages employed previous to my invention. In addition to permitting the building up of voltages sufficiently high to satisfactorily operate the control-device, the power-detector gives an output of sufficient amplitude to enable a single stage of power audio-frequency amplification to actuate, at maximum efficiency, all sound reproducing devices that previously required the use of several stages of audio-frequency amplification.

The input circuit of the first radio-frequency amplifying device may comprise a loop 106 tuned by a condenser 107. The stage may be neutralized, if desired, according to the teachings of the Rice Patent No. 1,334,118, by means of a condenser 108 connected between the output circuit thereof and one end of the loop.

Plate potential for the radio frequency amplifier 100, the first detector 101 and the intermediate frequency amplifier 102 is supplied through a conductor 110 which is connected to an appropriate point on a voltage source 111. Plate potential for the second detector 103 is supplied through a conductor 112 from a different point on the voltage source, and plate potential for the audio amplifier is supplied from a still different point on the same source, a loud speaker 113 being interposed in the last named connection.

The filaments of all of the tubes included in the amplifier proper are supplied from the same source (not shown) one terminal of which is connected to a common grounded conductor 114. The grounded conductor 114 is connected to an intermediate point on the voltage source 111, the point of connection being assumed to be at zero potential.

The grids of the thermionic devices comprised in the radio frequency amplifying stages and the intermediate frequency amplifying stages are connected by means of conductors 115 and 116 respectively to a second conductor 117 which terminates in a movable contact device 118 associated with a resistor 127, analogous in some respects to the resistor 51 shown in Fig. 1.

Grid biasing potential for the first detector tube is supplied from a point on the voltage source 111 which is approximately 9 volts negative with respect to the filament of the tube. Grid biasing potential for the second detector tube, which is of the power type, is supplied through a conductor 120 from a point on the voltage source 111 still more negative with respect to the filaments, and the audio frequency power-amplifier stage is supplied with grid biasing potential through a conductor 121 from a point more negative than the point which supplies the second detector grid bias.

A control tube 122, analogous in many respects to the control tube 45 shown in Fig. 1, has a filament 123, a grid 124, and a plate 125, and is provided with a grid, or input, circuit comprising a resistor 126 substantially the same as the resistor 56 in Fig. 1.

The output circuit of the control tube 122 comprises resistor 127, one end of which is connected to the plate 125 and the other end of which is connected to the zero, or grounded, point on the voltage source 111 by means of a conductor 128. The filament of the control tube is connected by a conductor 130 to a point on the voltage source which is 90 volts negative with respect to the zero point. This method of connection serves to impress a positive potential of 90 volts upon the plate of the control tube with respect to the filament thereof through the resistor 127.

The grid 124 of the control tube is connected to one end of the resistor 126, and the opposite end of the said resistor is connected to the filament 123 through a by-pass condenser 131, and is also connected by a conductor 132 to a point on the common voltage source which is 103 volts negative with respect to the zero, or ground point, thereon.

The grid of the control tube, accordingly, is normally biased to a potential approximately thirteen volts negative with respect to the filament thereof.

A conductor 129 is connected between the plate 125 and a point on the voltage source 111 approximately 20 volts negative with respect to the zero point, and interposed in this conductor is a switch device 133. A connection 134 extends between the input resistor 126 and the grid of the second detector tube, a coupling condenser 135 being interposed therein to prevent short-circuiting a portion of the voltage source 111.

The normal operation of this modification is substantially the same as the operation of that modification of my invention shown in Fig. 1, if the switch 133 is open. The grids of the thermionic devices in the radio frequency amplifier stage and the grids of the thermionic devices in the intermediate frequency amplifier stage are connected to a point on the output resistor 127 by means of the contact device 118. The lower end of the output resistor is connected by the conductors 128 to the filaments of these tubes. Consequently, a variable portion of the resistor 127 may be included between the grids and the filaments of the radio frequency and intermediate frequency amplifier tubes and the potential of the said grids with respect to the said filaments is thus determined by the IR or resistance drop in the said resistor.

By reason of the fact that the grid of the control tube is normally given a negative bias of approximately 13 volts with respect to the filament thereof, the tube conducts practically no current in the absence of an incoming signal. The amount of this current can, of course, be regulated by regulating the plate potential as well as the grid biasing potential.

When an incoming signal is impressed on the second detector tube, it is also impressed on the grid circuit of the control tube. An increase in the average amplitude of such signal causes an increase in the output current of the control tube which flows in the output resistor thus serving to give to the movable arm 118 a more negative potential with respect to the conductors 128 and 114 than it had previous to such amplitude-increase. Inasmuch as this movable arm is connected to the grids of the radio frequency and intermediate frequency amplifier tubes and the conductor 114 is connected to the filaments thereof, the said grids will accordingly acquire a more negative bias with respect to the filaments when the signal amplitude increases.

The system illustrated in Fig. 3, in which are utilized three-electrode thermionic devices of the usual and well-known type while perfectly operable to produce the desired result, has the slight disadvantage of necessitating two separate sources of filament power, one for the receiving apparatus proper and another for the control tube. In order to overcome this difficulty, I may also use thermionic devices of the equipotential cathode type, such, for example, as those shown in the patent to Nicolson, 1,459,412. In this modification of my invention (not shown) the heater elements of all of the tubes may be fed from a single secondary winding, inasmuch as the tubes may be so manufactured that the said elements are thoroughly insulated from the cathodes. The cathodes of all of the tubes may be connected to the same points in the circuit network that the filaments are shown as connected to in Fig. 3, no other alterations being necessary to change the system from direct to alternating current operation.

If it is desired to substitute manual for automatic volume control, the switch device 133 is closed and the resistor 127 is thereby connected in shunt to that portion of the voltage source 111 included between conductors 128 and 129. By manually adjusting the movable element 118 along the resistor, the grids of the radio frequency amplifier tubes and the grids of the intermediate frequency amplifier tubes may be given a potential varying from zero to the potential of the point on the voltage source to which the conductor 129 is connected, which point has a potential of minus 20 volts.

In the event that economy of construction is a major consideration, rather than maximum efficiency, the control-tube 122 and its associated circuits may be omitted, and the control-voltage derived directly from a resistor positioned in series in the plate circuit of the second detector tube. Inasmuch as the necessity for maintaining the cathode of the control tube at a high negative potential with respect to the cathodes of the tubes controlled thereby has been shown, if the control-tube is replaced by the second detector-tube, such tube must either be supplied from a separate A-battery, or must be of the equipotential, or heater-cathode, type. If of the latter type, the heater-winding, or filament, may be supplied with energy from the same A-battery that is utilized for the balance of the tubes, since the cathode is thoroughly insulated therefrom.

In order that the aforementioned modification of my invention may be made clear, reference should now be made to Fig. 4, which is a diagrammatic view of a portion of a superheterodyne receiving system utilizing a second detector tube 150 of the equipotential-type. The detector tube 150 comprises a heating winding 151, an encircling, thermionically active cathode 152, a grid 153 and a plate 154. An intermediate-frequency amplifier-tube 155 of the hot-cathode type is associated therewith by suitable circuit connections to be described in detail later, and comprises the usual filament 156, grid 157 and plate 158. A single A-battery 160, or other power source, supplies cathode energy for both the second detector tube, and the remaining amplifier tubes of the system, including the tube 155.

A single source 161 of plate and grid-biasing potential is provided, to an intermediate point 162 on which is connected the filaments of the amplifier-tubes by means of a conductor 163 having a grounded connection 164. The point 162 on the plate potential source is assumed to be at zero potential, and is the reference point from which the various potentials applied to the amplifier tubes are measured.

The cathode 152 of the detector-tube 150 is connected by a conductor 165 to a point 166 on the source 161 which has a negative potential of approximately 220 volts, and the grid 153 of the same tube is connected to a point 168 by a conductor 167, having a negative potential of approximately 250 volts, thus placing a negative bias of approximately 30 volts on the grid. The plate 154 is connected to a point 169 having a negative potential of about 9 volts, thus impressing a positive potential of about 211 volts thereon with respect to the cathode 152.

A resistor 170 is interposed in the plate circuit of the second detector-tube, and the grid 157 of the amplifier tube is connected to an appropriate point 171 thereon by a conductor 172. Inasmuch as the resistor 170 connects to a point on the source 161 which has a negative potential 9 volts with respect to the cathode of the amplifier tube, the grid of the latter tube is normally negatively biased to that extent. In some instances it may be desirable to positively bias the grid of the amplifier tube with respect to its cathode, and in such event the resistor is connected to a point on the source 161 which is positive with the respect to the point 162. All of the voltages specified are approximate, and they will, of course, vary according to the type of tubes utilized.

The operation of the modification of my invention just described is substantially the same as the operation of the modification illustrated in Fig. 3. Variations in the plate current of the detector-tube give rise to variations in the resistance voltage drop in the resistor 170 and cause the potential of the amplifier tube grid to be so changed with respect to the filament thereof that the effective amplification in said tube is altered. For example, if an incoming signal, by reason of "fading-in", or from any other cause, gradually increases in strength, the output of the detector tube increases proportionately, and the point on the resistor 171 to which the grid of the amplifier tube is connected assumes a more negative potential, and the effective amplification therein is reduced. If the incoming signal "fades-out", or diminishes in strength, the plate current of the detector tube is decreased, and the grid of the amplifier tube becomes more positive, thus increasing the effective amplification therein.

The principal advantage of my invention lies in the fact that it permits a multi-tube amplifier to operate with a substantially even sound-output, irrespective of the fading or changing in average amplitude of an incoming signal. This condition is very desirable in connection with receiving apparatus utilizing power amplifier tubes, inasmuch as the effect of varying signal amplitude is greatly accentuated thereby.

My invention has a further advantage in that it prevents the power amplifier tubes from being overloaded and consequently, injuring the sound reproducer.

Although I have illustrated and described only a few specific embodiments of my invention, numerous modifications thereof will be apparent to those skilled in the art. My invention, therefore, is not to be limited except insofar as is necessitated by the prior art or by the spirit of the appended claims.

I claim as my invention:

1. In combination, an amplifier comprising an electron tube device, a second tube device having a resistor in the output circuit thereof, means for supplying anode potential to said second device, continuously variable means for negatively biasing the grid of said second device to fix the output level of the amplifier, means for impressing signals on both of said electron tube devices, and means connecting said resistor with the grid of said first-mentioned triode whereby a tendency toward an increase in average signal amplitude results in a tendency for said grid to assume a more negative potential than it possessed previous to said amplitude-increase tendency.

2. In an amplifier, manually operable means for controlling the volume of the output therefrom, automatic means for controlling the volume irrespective of the amplitude of incoming signals, both of said means having elements in common, and manually operable means for selecting the type of control desirable.

3. In combination, an amplifier comprising a thermionic device arranged to amplify high frequency alternating currents, an electric discharge device connected with said thermionic device to control the effective amplification therein, means for impressing the high frequency alternating potential on said discharge device, and continuously variable means for rendering said discharge device responsive to potentials of any predetermined amplitude, whereby electric discharge devices of differing characteristics may be utilized and the output level of the amplifier may be preset at any desired value.

4. In combination, an amplifier comprising a thermionic device arranged to amplify high frequency alternating currents, a second thermionic device having a grid, means connected with said grid to impress said high frequency alternating currents thereon, said second thermionic device being connected with said first mentioned device to control the effective amplification therein, and continuously variable means whereby the potential of the grid of the second thermionic device may be adjusted relative to the filament thereof.

5. An amplifier having grid and anode electrodes, means for impressing signals on said amplifier, means responsive to variations in the average amplitude of said signals for controlling the amplification of said amplifier, said last means, comprising an electric discharge device having grid and anode electrodes, and common potential supply means electrically connected to said anodes and at least one of said grid electrodes for supplying said amplifier and control means with anode and bias potentials.

6. An amplifier comprising a plurality of thermionic devices having grid and anode-electrodes, a thermionic device of the equipotential type for controlling the amplification of said amplifier, said thermionic device having grid and anode electrodes, and potential supply means common to said anodes and at least one of said grids for supplying anode and grid potentials to said amplifier and control device.

7. An amplifier comprising a plurality of thermionic devices, means for impressing signals successively on said devices, signal-responsive means comprising an electron discharge device for controlling the effective amplification in certain of said devices, and potential supply means common to said amplifier and said control means for supplying the thermionic amplifying devices and the signal responsive means with plate potential and grid-biasing potential.

8. In combination, a plurality of signal amplifying thermionic devices connected in cascade, a signal responsive thermionic device for controlling the effective amplification of said amplifying devices, a common source of grid biasing and plate potentials for said devices, and connections whereby the cathode of said signal-responsive device is maintained at a high negative potential relative to the cathodes of said amplifying devices.

9. In combination, a plurality of signal-amplifying thermionic devices connected in cascade, a signal-responsive thermionic device for controlling the effective amplification of said amplifying devices, a common source of grid biasing and plate potentials for all of said devices, and connections whereby the cathode of said signal-responsive thermionic device is maintained at a high negative potential relative to the cathodes of said amplifying devices and the anode of said signal-responsive device may also be maintained negative with respect to said cathodes but positive with respect to the cathode of the signal-responsive device.

10. In a radio receiving system, a plurality of amplifying stages in cascade, means for deriving an audio-frequency current therefrom, sound reproducing means, control means actuated by an incoming signal derived from one of said amplifying stages, means connecting said control-means to one of said amplifying stages subsequent to the amplifying stage from which said signal was derived, and means providing a common source of anode current and biasing potential for said amplifying stages and said controlling means.

11. In an amplifier comprising a plurality of thermionic devices connected in cascade, said devices having input and output circuits, means for deriving a biasing potential from signal currents, said means also having input and output circuits, means for selectively coupling the input circuit of said bias potential deriving means across the input circuits of said thermionic devices, and means for selectively coupling the output circuit of said bias potential deriving means to said thermionic devices whereby said potentials may be applied to any one of said thermionic devices to control the degree of amplification therein.

12. In a radio receiving system, means for providing automatic volume-control and means, including a portion of said first-named means for simultaneously removing said automatic volume control and substituting manual volume control therefor.

13. An amplifier having grid and anode electrodes, means for impressing signals on said amplifier, means responsive to variations in the average amplitude of said signals for controlling the amplification of said amplifier, said last means comprising an electric discharge device having grid and anode electrodes, and common potential supply means electrically connected to said anodes and said grid electrodes for supplying said amplifier and control means with anode and bias potentials.

14. In combination, an amplifier comprising a plurality of electron discharge devices one of which is arranged and connected to function as a detector, a second detector device having an output circuit, means for impressing signal voltages simultaneously on the input circuits of both of said detector devices, said output circuit being coupled to input circuits of certain of said electron discharge devices preceding and following said first mentioned detector whereby changes in the current in said output circuit are effective to cause alterations in the grid potentials of said devices in said amplifier.

15. In a carrier current signalling system, an amplifier for said carrier current, means for automatically controlling the amplification of said amplifier in response to the variations in level of the received carrier, and means other than said automatic amplification controlling means for manually controlling the normal sensitivity of said amplifier independently of said automatic volume control means, said automatic volume control means and said manually adjustable sensitivity control means being connected in circuit between the same electrodes of an electron discharge device in said signalling system.

16. In a carrier current signalling system, an amplifier for said carrier current, means for automatically controlling the amplification of said amplifier in response to the level of the received carrier, and means other than said automatic amplification controlling means for manually controlling the normal sensitivity of said amplifier independently of said automatic volume control means, said automatic volume control means and said manually adjustable sensitivity control means being connected in series.

17. In a radio receiving system comprising an amplifier having a plurality of elements which contribute to the selectivity of said amplifier, means connected to an element of said amplifier for deriving a modulation frequency current from a received signal, automatic volume control means including a rectifier device for controlling the sensitivity of said amplifier, and means providing a lesser degree of selectivity from the input of said amplifier to said automatic volume control rectifier device than to said modulation current deriving means.

18. In a modulated carrier wave receiving system, a plurality of carrier current selector circuits connected in cascade, means responsive to variations in carrier current amplitude for automatically varying the carrier current transmission through the circuits, said last named means including a carrier current rectifier, a demodulator coupled to the last of said circuits, and means for increasing the ratio of the carrier wave potential applied to said carrier current rectifier to that applied to said demodulator, as the receiving system is tuned off-resonance from a desired carrier wave.

19. In a radio receiving system, a plurality of amplifying stages in cascade, means for deriving a modulation frequency current therefrom, control means actuated by an incoming signal derived from one of said amplifying stages to provide a gain-control potential, and means connecting said control means to apply said gain-control potential to at least one of said amplifying stages subsequent to, and preceding, the amplifying stage from which said signal for said control means was derived.

20. In a carrier current signalling system, an amplifier for said carrier current, means for automatically controlling the amplification of said amplifier in response to the level of the received carrier, and means other than said automatic amplification controlling means for manually controlling the normal sensitivity of said amplifier independently of said automatic volume control means.

21. In a radio receiving system, an amplifier circuit followed by a detector circuit, said receiving system being less selective at said amplifier stage than at said detector, and an auto-controlling the normal sensitivity of said amplifier circuit to derive control potentials therefrom, the coupling for said automatic volume control circuit with said amplifier circuit providing a lesser degree of selectivity than the selectivity of said receiving system at the detector circuit.

22. In a radio receiving system, a detector circuit, an amplifier circuit preceding said detector circuit, an automatic volume control circuit and means for coupling said automatic volume control circuit to said amplifier to derive control potentials therefrom and providing less selectivity than said detector circuit, said last named means providing a lesser degree of selectivity in said coupling than the selectivity of said radio receiving system at said detector circuit.

23. In a carrier current signalling system, an amplifier for said carrier current, means for automatically controlling the amplification of said amplifier in response to the level of the received carrier, means other than said automatic amplification controlling means for manually controlling the normal sensitivity of said amplifier independently of said automatic volume control means, said automatic controlling means including a source of variable biasing potential and said manual controlling means including a fixed source of biasing potential and manually operable means for deriving a variable biasing potential from said source, and means for selectively causing the fixed or the variable source of biasing potential to become effective to provide the main controlling biasing potential for said amplifier.

GEORGE L. BEERS.